US012667008B2

(12) United States Patent
Kwon et al.

(10) Patent No.: US 12,667,008 B2
(45) Date of Patent: Jun. 23, 2026

(54) DISPLAY DEVICE

(71) Applicant: LG Display Co., Ltd., Seoul (KR)

(72) Inventors: Hyowon Kwon, Suwon-si (KR);
HyeMi Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 607 days.

(21) Appl. No.: 17/981,111

(22) Filed: Nov. 4, 2022

(65) Prior Publication Data

US 2023/0207537 A1     Jun. 29, 2023

(30) Foreign Application Priority Data

Dec. 29, 2021     (KR) ........................ 10-2021-0190729

(51) Int. Cl.
| | |
|---|---|
| *H10H 29/49* | (2025.01) |
| *H10H 29/01* | (2025.01) |
| *H10H 29/34* | (2025.01) |
| *H10W 70/60* | (2026.01) |
| *H10W 70/67* | (2026.01) |
| *H10W 90/00* | (2026.01) |
| *H10P 72/70* | (2026.01) |

(52) U.S. Cl.
CPC .......... *H10W 90/00* (2026.01); *H10H 29/012* (2025.01); *H10H 29/34* (2025.01); *H10H 29/49* (2025.01); *H10W 70/611* (2026.01); *H10W 70/688* (2026.01); *H10P 72/7432* (2026.01); *H10P 72/744* (2026.01)

(58) Field of Classification Search
CPC . H01L 25/0753; H01L 25/167; H10H 20/857; H10H 29/49; H10H 29/142; H10W 90/00
See application file for complete search history.

(56) References Cited

U.S. PATENT DOCUMENTS

| | | | | |
|---|---|---|---|---|
| 2019/0198709 A1* | 6/2019 | Wildeson | ............. | H05B 47/195 |
| 2019/0237449 A1* | 8/2019 | Shin | ..................... | H10H 29/142 |
| 2021/0134877 A1* | 5/2021 | Kim | ..................... | H10H 29/142 |
| 2021/0280753 A1* | 9/2021 | Kim | ........................ | H10H 20/01 |

FOREIGN PATENT DOCUMENTS

| | | |
|---|---|---|
| KR | 20200121714 A | 10/2020 |
| KR | 10-2021-0012391 A | 2/2021 |
| WO | WO 2020213937 A1 | 10/2020 |

* cited by examiner

*Primary Examiner* — Yu Chen
(74) *Attorney, Agent, or Firm* — Seed Intellectual Group LLP

(57) ABSTRACT

A display device according to an example embodiment of the present disclosure includes a stretchable lower substrate; and a pattern layer disposed on the lower substrate and including a plurality of plate patterns on which a plurality of sub-pixels are disposed and a plurality of line patterns; a plurality of individual connection pads and a common connection pad disposed on each of the plurality of plate patterns and having different heights corresponding to each of the plurality of sub-pixels; and a plurality of light emitting elements connected to the plurality of individual connection pads and the common connection pad.

9 Claims, 8 Drawing Sheets

DISPLAY DEVICE

CROSS-REFERENCE TO RELATED APPLICATIONS

This application claims the benefit of and priority to Korean Patent Application No. 10-2021-0190729 filed on Dec. 29, 2021, in the Republic of Korea, the entire contents of which are hereby expressly incorporated by reference into the present application.

BACKGROUND

Technical Field

The present disclosure relates to a display device, and more particularly, to a display device allowing for simplification of a transfer process.

Description of the Related Art

Display devices used for a computer monitor, a TV, a mobile phone, and the like include an organic light emitting display (OLED) that emits light by itself, a liquid-crystal display (LCD) that requires a separate light source, and the like.

Such display devices are being applied to more and more various fields including not only a computer monitor and a TV, but personal mobile devices, and thus, display devices having a reduced volume and weight while having a wide active area are being studied.

Recently, a display device that is manufactured to be stretchable in a specific direction and changeable into various shapes by forming a display unit, lines, and the like on a flexible substrate such as plastic that is a flexible material has received considerable attention as a next-generation display device.

BRIEF SUMMARY

An aspect of the present disclosure is to provide a display device in which when a plurality of light emitting elements are transferred, interference with light emitting elements that have been transferred is reduced or minimized.

Another aspect of the present disclosure is to provide a display device in which a manufacturing process time and costs are reduced by omitting a step of transferring a plurality of light emitting elements to a donor substrate.

Still another aspect of the present disclosure is to provide a display device capable of reducing or minimizing a defect rate of a landscape structure.

Technical benefits of the present disclosure are not limited to the above-mentioned benefits, and other benefits, which are not mentioned above, can be clearly understood by those skilled in the art from the following descriptions.

A display device according to an example embodiment of the present disclosure includes a stretchable lower substrate; and a pattern layer disposed on the lower substrate and including a plurality of plate patterns on which a plurality of sub-pixels are disposed and a plurality of line patterns; a plurality of individual connection pads and a common connection pad disposed on each of the plurality of plate patterns and having different heights corresponding to each of the plurality of sub-pixels; and a plurality of light emitting elements connected to the plurality of individual connection pads and the common connection pad.

A display device according to another example embodiment of the present disclosure includes a stretchable lower substrate including an active area and a non-active area outside the active area; a plurality of plate patterns which are disposed on the lower substrate and on which a plurality of pixels including a plurality of sub-pixels are disposed in the active area; a common connection pad formed of a plurality of layers on each of the plurality of plate patterns; and a plurality of individual connection pads corresponding to each of the plurality of sub-pixels and formed of at least one layer.

A method of manufacturing display device according to an example embodiment of the present disclosure includes forming at least one temporary pattern on a wafer; forming at least one light emitting element on the at least one temporary pattern, respectively; providing at least one individual connection pad on a display panel; separating the at least one light emitting element from the at least one temporary pattern; and transferring the at least one light emitting element to the at least one individual connection pad on the display panel, respectively.

Other detailed matters of the example embodiments are included in the detailed description and the drawings.

According to the present disclosure, by disposing a plurality of individual connection pads and a common connection pad having different heights corresponding to each of a plurality of sub-pixels, it is possible to reduce or minimize interference between light emitting elements that have been transferred and light emitting elements on a wafer when a plurality of light emitting elements are transferred.

According to the present disclosure, since light emitting elements are directly transferred from a wafer to a display panel, it is possible to reduce a process time and cost and improve productivity when manufacturing a display device.

The effects according to the present disclosure are not limited to the contents exemplified above, and more various effects are included in the present specification.

DETAILED DESCRIPTION

Figure 1:
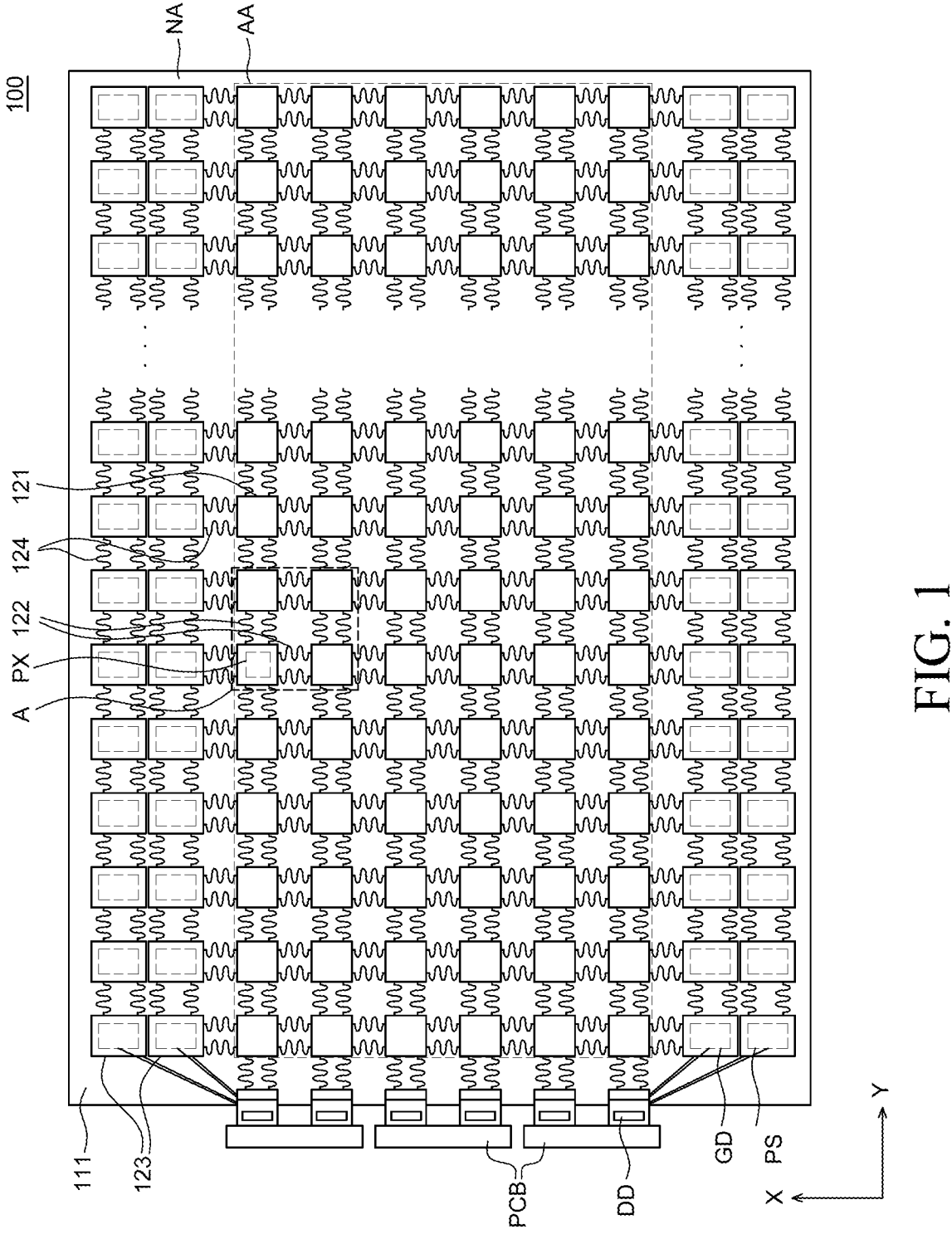
FIG. 1 is a plan view of a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to example embodiments of the present disclosure will be described in detail with reference to accompanying drawing.

A display device according to an example embodiment of the present disclosure is a display device capable of displaying an image even if it is bent or stretched, and may also be referred to as a stretchable display device or a flexible display device. The display device may have higher flexibility and stretchability than conventional, typical display devices. Accordingly, a user can bend or stretch the display device, and a shape of the display device can be freely changed according to the user's manipulation. For example, when the user grabs and pulls an end of the display device, the display device may be stretched in a pulling direction by the user. If the user places the display device on an uneven outer surface, the display device can be disposed to be bent according to a shape of the outer surface. When force applied by the user is removed, the display device can return to an original shape thereof.

Stretchable Substrate and Pattern Layer

Figure 2:
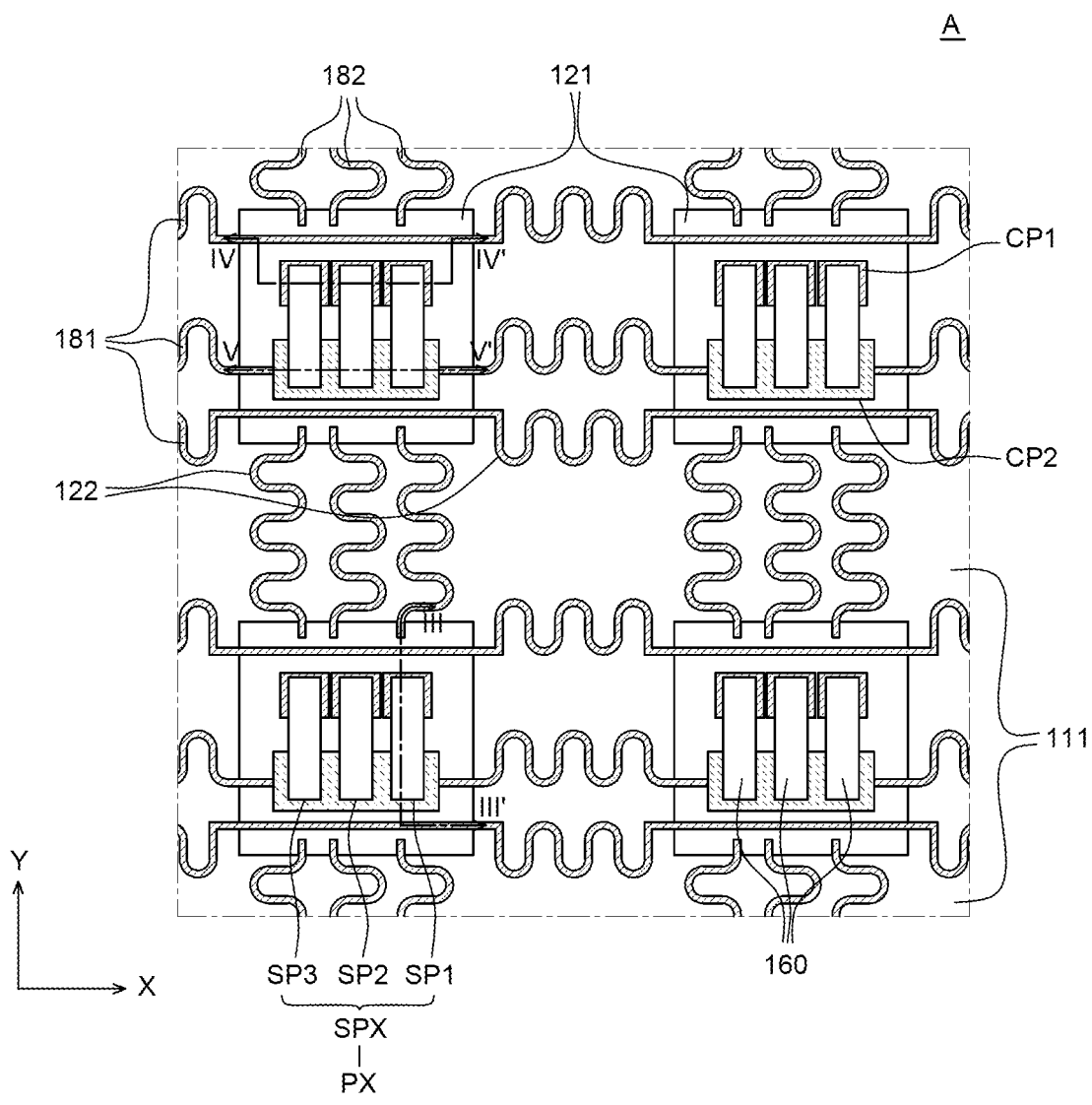
FIG. 2 is an enlarged plan view of an active area of the display device according to an example embodiment of the present disclosure.
Figure 3:
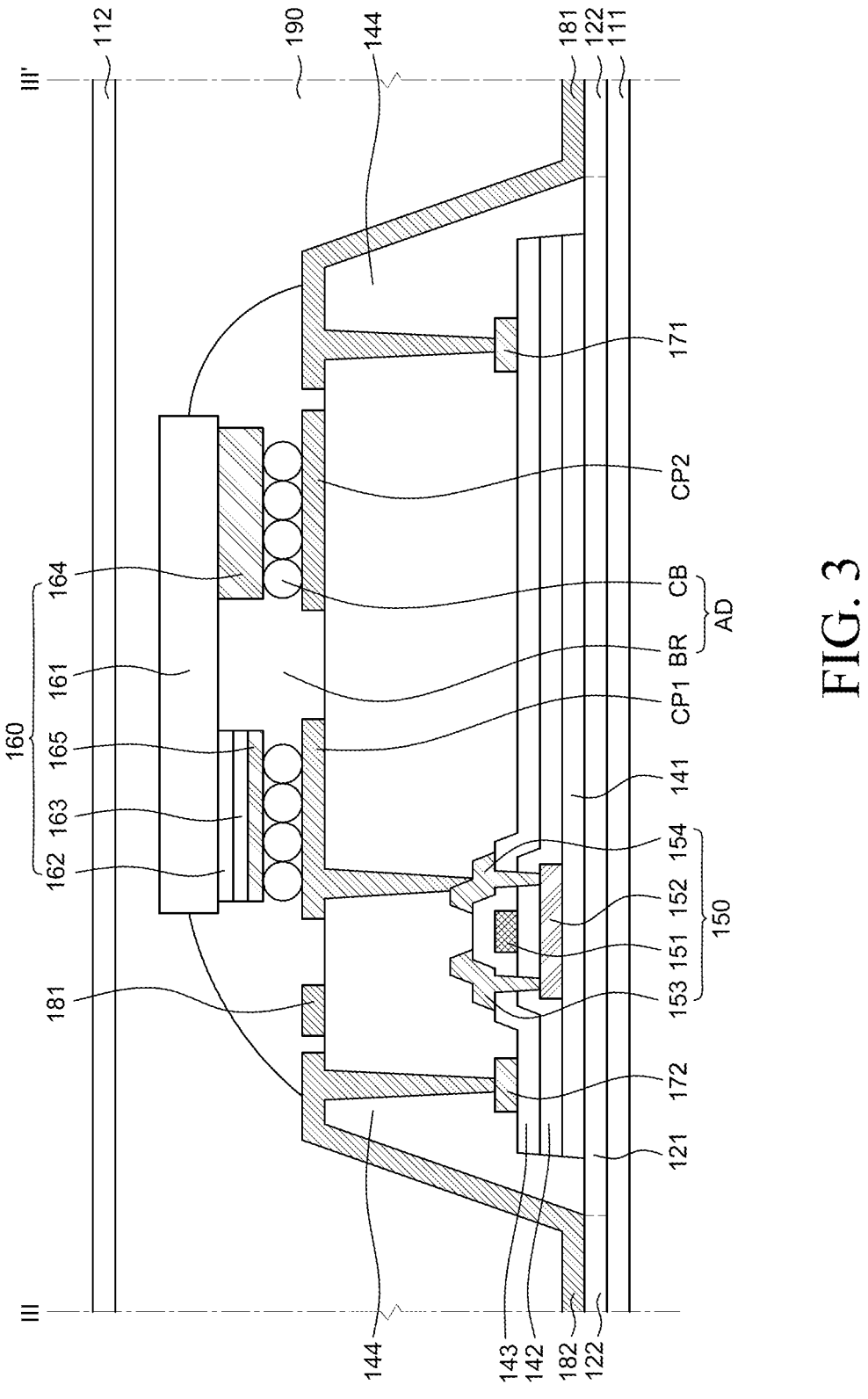
FIG. 3 is a cross-sectional view taken along cutting line III-III' shown in FIG. 2.

FIG. 1 is a plan view of a display device according to an example embodiment of the present disclosure. FIG. 2 is an enlarged plan view of an active area of the display device according to an example embodiment of the present disclosure. FIG. 3 is a cross-sectional view taken along cutting line III-III' shown in FIG. 2. Specifically, FIG. 2 is an enlarged plan view of area A illustrated in FIG. 1, and FIG. 3 is a cross-sectional view of a first sub-pixel SP1 among a plurality of sub-pixels SPX illustrated in FIG. 2.

Referring to FIG. 1, a display device 100 according to an example embodiment of the present disclosure may include a lower substrate 111, a pattern layer 120, a plurality of pixels PX, gate drivers GD, data drivers DD, and power supplies PS. And, referring to FIG. 3, the display device 100 according to an example embodiment of the present disclosure may further include a filling layer 190 and an upper substrate 112.

The lower substrate 111 is a substrate for supporting and protecting various components of the display device 100. For example, the lower substrate 111 is a substrate that supports the pattern layer 120 on which the pixels PX, the gate drivers GD, and the power supplies PS are formed. In addition, the upper substrate 112 is a substrate for covering and protecting various components of the display device 100. For example, the upper substrate 112 is a substrate that covers the pixels PX, the gate drivers GD, and the power supplies PS.

Each of the lower substrate 111 and the upper substrate 112 is a ductile substrate and may be formed of an insulating material that can be bent or stretched. For example, each of the lower substrate 111 and the upper substrate 112 may be formed of silicone rubber such as polydimethylsiloxane (PDMS) or elastomers such as polyurethane (PU) and polytetrafluoroethylene (PTFE), and thus, may have flexible properties. In addition, materials of the lower substrate 111 and the upper substrate 112 may be the same, but are not limited thereto and may be variously modified.

Each of the lower substrate 111 and the upper substrate 112 is a ductile substrate and may be reversibly expandable and contractible. Accordingly, the lower substrate 111 may be referred to as a lower stretchable substrate, a lower flexible substrate, a lower extendable substrate, a lower ductile substrate, a first stretchable substrate, a first flexible substrate, a first extendable substrate, or a first ductile substrate, and the upper substrate 112 may be referred to as an upper stretchable substrate, an upper flexible substrate, an upper extendable substrate, an upper ductile substrate, a second stretchable substrate, a second flexible substrate, a second extendable substrate, or a second ductile substrate. Further, moduli of elasticity of the lower substrate 111 and the upper substrate 112 may be several MPa to several hundreds of MPa. Further, a ductile breaking rate of the lower substrate 111 and the upper substrate 112 may be 100% or higher. Here, the ductile breaking rate refers to a stretching rate at a time in which an object stretched is broken or cracked. Differently put, the ductile breaking rate refers to an extension distance when an object to be stretched is broken or cracked. That is, the ductile breaking rate is defined as a percentage ratio of a length of an original object and a length of the stretched object when an object has been stretched sufficiently that it is considered broken. For example, if a length of an object (e.g., lower substrate 110a) is 100 cm when the object is not stretched and then, it reaches a length of 110 cm when the object has been stretched enough that it becomes broken or cracked at this length, then it has been stretched to 110% of its original length. In this case, the ductile breaking rate of the object is 110%. The number could thus also be called a ductile breaking ratio since it is a ratio of the stretched length as the numerator compared to the original upstretched length as the denominator at the time the break occurs.

A thickness of the lower substrate may be 10 μm to 1 mm, but is not limited thereto.

The lower substrate 111 may have an active area AA and a non-active area NA surrounding the active area AA. However, the active area AA and the non-active area NA are not limited only to the lower substrate 111 and may be referred throughout the display device 100.

The active area AA is an area in which an image is displayed on the display device 100. The plurality of pixels PX are disposed in the active area AA. In addition, each of the pixels PX may include a display element and various driving elements for driving the display element. The various driving elements may mean at least one thin film transistor TFT and a capacitor, but are not limited thereto. In addition, each of the plurality of pixels PX may be connected to various lines. For example, each of the plurality of pixels PX may be connected to various lines such as gate lines, data lines, high potential voltage lines, low potential voltage lines, reference voltage lines and initialization voltage lines.

The non-active area NA is an area in which an image is not displayed. The non-active area NA may be disposed adjacent to the active area AA. And, the non-active area NA may be an area that is adjacent to the active area AA and surrounds the active area AA. However, the present disclosure is not limited thereto, and the non-active area NA corresponds to an area of the lower substrate 111 excluding the active area AA and may be changed and separated into various shapes. Components for driving the plurality of pixels PX disposed in the active area AA are disposed in the non-active area NA. The gate drivers GD and power supplies PS may be disposed in the non-active area NA. In addition, a plurality of pads that are connected to the gate drivers GD and the data drivers DD may be disposed in the non-active area NA, and each of the pads may be connected to each of the plurality of pixels PX in the active area AA.

On the lower substrate 111, the pattern layer 120 including a plurality of first plate patterns 121 and a plurality of first line patterns 122 that are disposed in the active area AA and a plurality of second plate patterns 123 and a plurality of second line patterns 124 that are disposed in the non-active area NA is disposed.

The plurality of first plate patterns 121 are disposed in the active area AA of the lower substrate 111. The plurality of pixels PX are formed on the plurality of first plate patterns 121. In addition, the plurality of second plate patterns 123 may be disposed in the non-active area NA of the lower substrate 111. In addition, the gate drivers GD and the power supplies PS are formed on the plurality of second plate patterns 123.

The plurality of first plate patterns 121 and the plurality of second plate patterns 123 as described above may be disposed in the form of islands that are spaced apart from each other. Each of the plurality of first plate patterns 121 and the plurality of second plate patterns 123 may be individually separated. Accordingly, the plurality of first plate patterns 121 and the plurality of second plate patterns 123 may be referred to as first island patterns and second island patterns, or first individual patterns and second individual patterns.

Specifically, the gate drivers GD may be mounted on the plurality of second plate patterns 123. The gate driver GD may be formed on the second plate pattern 123 in a gate in panel (GIP) method when various components on the first plate pattern 121 are manufactured. Accordingly, various circuit components constituting the gate drivers GD such as various transistors, capacitors, and lines may be disposed on the plurality of second plate patterns 123. However, the present disclosure is not limited thereto, and the gate driver GD may be mounted in a chip on film (COF) method.

In addition, the power supplies PS may be mounted on the plurality of second plate patterns 123. The power supply PS may be formed on the second plate pattern 123 with a plurality of power blocks that are patterned when various components on the first plate pattern 121 are manufactured. Accordingly, the power blocks disposed on different layers may be disposed on the second plate pattern 123. Thus, a lower power block and an upper power block may be sequentially disposed on the second plate pattern 123. In addition, a low potential power voltage may be applied to the lower power block, and a high potential power voltage may be applied to the upper power block. Accordingly, the low potential power voltage may be supplied to the plurality of pixels PX through the lower power block. In addition, the high potential power voltage may be supplied to the plurality of pixels PX through the upper power block.

Referring to FIG. 1, sizes of the plurality of second plate patterns 123 may be greater than sizes of the plurality of first plate patterns 121. Specifically, the size of each of the plurality of second plate patterns 123 may be greater than the size of each of the plurality of first plate patterns 121. As described above, the gate driver GD may be disposed on each of the plurality of second plate patterns 123, and one stage of the gate driver GD may be disposed on each of the plurality of second plate patterns 123. Accordingly, since an area that is occupied by various circuit components constituting one stage of the gate driver GD is relatively greater than an area occupied by the pixels PX, the size of each of the plurality of second plate patterns 123 may be greater than the size of each of the plurality of the first plate patterns 121.

In FIG. 1, the plurality of second plate patterns 123 are illustrated as being disposed on both sides in a first direction X in the non-active area NA, but the present disclosure is not limited thereto, and the plurality of second plate patterns 123 may be disposed in any region of the non-active area NA. In addition, although the plurality of first plate patterns 121 and the plurality of second plate patterns 123 are shown in a quadrangular shape, the present disclosure is not limited thereto, and the plurality of first plate patterns 121 and the plurality of second plate patterns 123 are changeable in various forms.

Referring to FIG. 1, the pattern layer 120 may further include the plurality of first line patterns 122 disposed in the active area AA and the plurality of second line patterns 124 disposed in the non-active area NA.

The plurality of first line patterns 122 are patterns that are disposed in the active area AA and connect the first plate patterns 121 adjacent to each other, and may be referred to as first connection patterns. That is, the plurality of first line patterns 122 are disposed between the plurality of first plate patterns 121.

The plurality of second line patterns 124 may be patterns that are disposed in the non-active area NA and connect the first plate patterns 121 and the second plate patterns 123 adjacent to each other or the plurality of second plate patterns 123 adjacent to each other. Accordingly, the plurality of second line patterns 124 may be referred to as second connection patterns. And, the plurality of second line patterns 124 may be disposed between the first plate patterns 121 and the second plate patterns 123 that are adjacent to each other, and between the plurality of second plate patterns 123 adjacent to each other.

Referring to FIG. 1, the plurality of first line patterns 122 and the plurality of second line patterns 124 have a wavy shape. For example, the plurality of first line patterns 122 and the plurality of second line patterns 124 may have a sine wave shape. However, the shapes of the plurality of first line patterns 122 and the plurality of second line patterns 124 are not limited thereto. For example, the plurality of first line patterns 122 and the plurality of second line patterns 124 may extend in a zigzag manner. Alternatively, the plurality of first line patterns 122 and the plurality of the second line patterns 124 may have various shapes, such as shapes in which a plurality of rhombus-shaped substrates are extended by being connected at vertices thereof. The numbers and shapes of the plurality of first line patterns 122 and the second line patterns 124 illustrated in FIG. 1 are example, and the numbers and shapes of the plurality of first line patterns 122 and the second line patterns 124 may be variously changed according to design.

In addition, the plurality of first plate patterns 121, the plurality of first line patterns 122, the plurality of second plate patterns 123, and the plurality of second line patterns 124 are rigid patterns. That is, the plurality of first plate patterns 121, the plurality of first line patterns 122, the plurality of second plate patterns 123, and the plurality of second line patterns 124 may be rigid compared to the lower substrate 111 and the upper substrate 112. Accordingly, moduli of elasticity of the plurality of first plate patterns 121, the plurality of first line patterns 122, the plurality of second plate patterns 123, and the plurality of second line patterns 124 may be higher than a modulus of elasticity of the lower substrate 111. The modulus of elasticity is a parameter representing a rate of deformation against a stress applied to a substrate. When the modulus of elasticity is relatively high, hardness may be relatively high. Accordingly, the plurality of first plate patterns 121, the plurality of first line patterns 122, the plurality of second plate patterns 123, and the plurality of second line patterns 124 may be referred to as a plurality of first rigid patterns, a plurality of second rigid patterns, a plurality of third rigid patterns, and a plurality of fourth rigid patterns, respectively. The moduli of elasticity of the plurality of first plate patterns 121, the plurality of first line patterns 122, the plurality of second plate patterns 123, and the plurality of second line patterns 124 may be 1000 times higher than the moduli of elasticity of the lower substrate 111 and the upper substrate 112, but the present disclosure is not limited thereto.

The plurality of first plate patterns 121, the plurality of first line patterns 122, the plurality of second plate patterns 123, and the plurality of second line patterns 124 that are a plurality of rigid substrates may be formed of a plastic material having flexibility that is lower than that of the lower substrate 111 and the upper substrate 112. For example, the plurality of first plate patterns 121, the plurality of first line patterns 122, the plurality of second plate patterns 123, and the plurality of second line patterns 124 may be formed of at least one material among polyimide (PI), polyacrylate, and polyacetate. In this case, the plurality of first plate patterns 121, the plurality of first line patterns 122, the plurality of second plate patterns 123, and the plurality of second line patterns 124 may be formed of the same material, but they are not limited thereto and may be formed of different materials. When the plurality of first plate patterns 121, the plurality of first line patterns 122, the plurality of second plate patterns 123, and the plurality of second line patterns 124 are formed of the same material, they may be integrally formed.

In some embodiments, the lower substrate 111 may be defined as including a plurality of first lower patterns and a second lower pattern. The plurality of first lower patterns may be areas of the lower substrate 111 that overlap the plurality of first plate patterns 121 and the plurality of second plate patterns 123. The second lower pattern may be an area that does not overlap the plurality of first plate patterns 121 and the plurality of second plate patterns 123.

Also, the upper substrate 112 may be defined as including a plurality of first upper patterns and a second upper pattern. The plurality of first upper patterns may be areas of the upper substrate 112 that overlap the plurality of first plate patterns 121 and the plurality of second plate patterns 123. The second upper pattern may be an area that does not overlap the plurality of first plate patterns 121 and the plurality of second plate patterns 123.

In this case, moduli of elasticity of the plurality of first lower patterns and first upper patterns may be greater than moduli of elasticity of the second lower patterns and the second upper patterns. For example, the plurality of first lower patterns and the first upper patterns may be formed of the same material as the plurality of first plate patterns 121 and the plurality of second plate patterns 123, and the second lower pattern and the second upper pattern may be formed of a material having a modulus of elasticity lower than those of the plurality of first plate patterns 121 and the plurality of second plate patterns 123.

That is, the first lower pattern and the first upper pattern may be formed of polyimide (PI), polyacrylate, polyacetate, or the like and the second lower pattern and the second upper pattern may be formed of silicon rubber such as polydimethylsiloxane (PDMS) or elastomers such as polyurethane (PU) and polytetrafluoroethylene (PTFE).

Non-Active Area Driving Element

Referring to FIG. 1, the gate drivers GD are components which supply a gate voltage to the plurality of pixels PX disposed in the active area AA. The gate drivers GD include a plurality of stages formed on the plurality of second plate patterns 123 and respective stages of the gate drivers GD may be electrically connected to each other through a plurality of gate connection lines. Accordingly, a gate voltage output from any one of stages may be transmitted to another stage. Further, the respective stages may sequentially supply the gate voltage to the plurality of pixels PX connected to the respective stages.

The power supplies PS may be connected to the gate drivers GD and supply a gate driving voltage and a gate clock voltage. Further, the power supplies PS may be connected to the plurality of pixels PX and supply a pixel driving voltage to each of the plurality of pixels PX. The power supplies PS may also be formed on the plurality of second plate patterns 123. That is, the power supplies PS may be formed on the plurality of second plate patterns 123 to be adjacent to the gate drivers GD. Further, each of the power supplies PS formed on the plurality of second plate patterns 123 may be electrically connected to the gate driver GD and the plurality of pixels PX. That is, the plurality of power supplies PS formed on the plurality of second plate patterns 123 may be connected by a gate power supply connection line and a pixel power supply connection line. Therefore, each of the plurality of power supplies PS may supply a gate driving voltage, a gate clock voltage, and a pixel driving voltage.

The printed circuit board PCB is a component which transmits signals and voltages for driving the display element from a control unit to the display element. Therefore, the printed circuit board PCB may also be referred to as a driving substrate. A control unit such as an IC chip or a circuit may be mounted on the printed circuit board PCB. Further, a memory, a processor or the like may be mounted on the printed circuit board PCB. Further, the printed circuit board PCB provided in the display device 100 may include a stretchable area and a non-stretchable area to secure stretchability. Also, on the non-stretchable area, an IC chip, a circuit, a memory, a processor and the like may be mounted, and in the stretchable area, lines electrically connected to the IC chip, the circuit, the memory and the processor may be disposed.

The data driver DD is a component which supplies a data voltage to the plurality of pixels PX disposed in the active area AA. The data driver DD may be configured in a form of an IC chip and thus, may also be referred to as a data integrated circuit D-IC. Further, the data driver DD may be mounted on the non-stretchable area of the printed circuit board PCB. That is, the data driver DD may be mounted on the printed circuit board PCB in a form of a chip on board (COB). Although in FIG. 1, it is illustrated that the data driver DD is mounted in a chip on board (COB) manner, the present disclosure is not limited thereto and the data driver DD may be mounted in a chip on film (COF), a chip on glass (COG), a tape carrier package (TCP) manner, or the like.

Also, although it is illustrated in FIG. 1 that one data driver DD is disposed to correspond to a line of the first plate patterns 121 disposed in the active area AA, the present disclosure is not limited thereto. That is, one data driver DD may be disposed to correspond to a plurality of columns of the first plate patterns 121.

Hereinafter, FIGS. 1 to 3 are referred together for a more detailed description of the active area AA of the display device 100 according to an example embodiment of the present disclosure.

Planar and Cross-Sectional Structures of Active Area

Referring to FIG. 1 and FIG. 2, the plurality of first plate patterns 121 are disposed on the lower substrate 111 in the active area AA. The plurality of first plate patterns 121 are disposed to be spaced apart from each other on the lower substrate 111. For example, the plurality of first plate patterns 121 may be disposed in a matrix form on the lower substrate 111 as shown in FIG. 1, but are not limited thereto.

Referring to FIGS. 2 and 3, pixels PX including a plurality of sub-pixels SPX are disposed on the first plate pattern 121. One pixel PX includes three sub-pixels SP1, SP2, and SP3. For example, the pixel PX may include a first sub-pixel SP1, a second sub-pixel SP2, and a third sub-pixel SP3 as shown in FIG. 2. Also, the first sub-pixel SP1 may be a red sub-pixel, the second sub-pixel SP2 may be a blue sub-pixel, and the third sub-pixel SP3 may be a green sub-pixel. However, the present disclosure is not limited thereto, and the plurality of sub-pixels SPX may be changed to have various colors such as magenta, yellow, and cyan.

Each of the sub-pixels SPX may include a light emitting element 160 that is a display element and a transistor 150 for driving the light emitting element 160. However, the display element in the sub-pixel SPX is not limited to an LED, but may be an organic light emitting diode.

The plurality of sub-pixels SPX may be connected to a plurality of connection lines 180. That is, the plurality of sub-pixels SPX may be electrically connected to a first connection lines 181 extending in the first direction X. In addition, the plurality of sub-pixels SPX may be electrically connected to a second connection lines 182 extending in a second direction Y.

Hereinafter, a cross-sectional structure of the active area AA will be described in detail with reference to FIG. 3. FIG.

3 illustrates only a cross-sectional view of the first sub-pixel SP1 for convenience of explanation of common features of each of the plurality of sub-pixels SPX.

Referring to FIG. 3, a plurality of inorganic insulating layers are disposed on the plurality of first plate patterns 121. For example, the plurality of inorganic insulating layers may include a buffer layer 141, a gate insulating layer 142, and an interlayer insulating layer 143, but are not limited thereto. Various inorganic insulating layers may be additionally disposed on the plurality of first plate patterns 121, and one or more of the buffer layer 141, the gate insulating layer 142, and the interlayer insulating layers 143 that are inorganic insulating layers may be omitted therefrom.

Specifically, the buffer layer 141 is disposed on the plurality of first plate patterns 121. The buffer layer 141 is formed on the plurality of first plate patterns 121 to protect various components of the display device 100 against permeation of moisture ($H_2O$), oxygen ($O_2$) and the like from the outside of the lower substrate 111 and the plurality of first plate patterns 121. The buffer layer 141 may be formed of an insulating material. For example, the buffer layer 141 may be composed as a single layer or multiple layers formed of at least one of silicon nitride (SiNx), silicon oxide (SiOx), and silicon oxynitride (SiON). However, the buffer layer 141 may be omitted depending on a structure or characteristics of the display device 100.

In this case, the buffer layer 141 may be formed only in an area where the buffer layer 141 overlaps the plurality of first plate patterns 121 and the plurality of second plate patterns 123. As described above, the buffer layer 141 may be formed of an inorganic material. Thus, the buffer layer 141 may be easily damaged, such as easily cracked, while the display device 100 is stretched. Therefore, the buffer layer 141 may not be formed in areas between the plurality of first plate patterns 121 and the plurality of second plate patterns 123. The buffer layer 141 may be patterned into shapes of the plurality of first plate patterns 121 and the plurality of second plate patterns 123 and formed only on upper portions of the plurality of first plate patterns 121 and the plurality of second plate patterns 123. Accordingly, in the display device 100 according to an example embodiment of the present disclosure, the buffer layer 141 is formed only in the area where the buffer layer 141 overlaps the plurality of first plate patterns 121 and the plurality of second plate patterns 123 which are rigid substrates, so that damage to various components of the display device 100 may be prevented even when the display device 100 is deformed, such as bent or stretched.

Referring to FIG. 3, the transistor 150 including a gate electrode 151, an active layer 152, a source electrode 153, and a drain electrode 154 is formed on the buffer layer 141.

First, referring to FIG. 3, the active layer 152 is disposed on the buffer layer 141. For example, the active layer 152 may be formed of an oxide semiconductor. For example, the active layer 152 may be formed of indium-gallium-zinc oxide, indium-gallium oxide, or indium-zinc oxide. Alternatively, the active layer 152 may be formed of amorphous silicon (a-Si), polycrystalline silicon (poly-Si), or an organic semiconductor.

The gate insulating layer 142 is disposed on the active layer 152. The gate insulating layer 142 is a layer for electrically insulating the gate electrode 151 and the active layer 152. In addition, the gate insulating layer 142 may be formed of an insulating material. For example, the gate insulating layer 142 may be formed as a single layer of silicon nitride (SiNx) or silicon oxide (SiOx) or multiple layers of silicon nitride (SiNx) or silicon oxide (SiOx), but is not limited thereto.

The gate electrode 151 is disposed on the gate insulating layer 142. In addition, the gate electrode 151 overlaps the active layer 152.

The gate electrode 151 may be formed of any one of various metal materials, for example, molybdenum (Mo), aluminum (Al), chromium (Cr), gold (Au), titanium (Ti), nickel (Ni), neodymium (Nd) and copper (Cu), an alloy of two or more of them, or multiple layers thereof, but the present disclosure is not limited thereto.

The interlayer insulating layer 143 is disposed on the gate electrode 151. The interlayer insulating layer 143 may be formed of an inorganic material in the same manner as the buffer layer 141. For example, the interlayer insulating layer 143 may be formed as a single layer of silicon nitride (SiNx) or silicon oxide (SiOx) or multiple layers of silicon nitride (SiNx) or silicon oxide (SiOx), but is not limited thereto.

The source electrode 153 and the drain electrode 154 of the transistor 150 are disposed on the interlayer insulating layer 143. The source electrode 153 and the drain electrode 154 of the transistor 150 are spaced apart from each other on the same layer. In addition, in the transistor 150, the source electrode 153 and the drain electrode 154 may be electrically connected to the active layer 152 in a manner in contact with the active layer 152.

The source electrode 153 and the drain electrode 154 may be formed of any one of various metal materials, for example, molybdenum (Mo), aluminum (Al), chromium (Cr), gold (Au), titanium (Ti), nickel (Ni), neodymium (Nd) and copper (Cu), an alloy of two or more of them, or multiple layers thereof, but the present disclosure is not limited thereto.

FIG. 3 shows only a driving transistor 150 among various transistors that may be included in the display device 100 for convenience of explanation, but a switching transistor, a capacitor and the like may also be included in the display device 100. In addition, although it has been described herein that the transistor 150 has a coplanar structure, various transistors such as having a staggered structure or the like may also be used. Also, in the present specification, the transistor may be formed not only in a top gate structure but also in a bottom gate structure A power pad 171 among a plurality of pads 170 is disposed on the interlayer insulating layer 143. The power pad 171 is a pad for transmitting a power voltage to the plurality of sub-pixels SPX. The power voltage may be transmitted from the power pad 171 to a pixel circuit through a line formed on the first plate pattern 121. The power pad 171 may be formed of the same material on the same layer as the source electrode 153 and the drain electrode 154, but is not limited thereto.

A data pad 172 among the plurality of pads 170 is disposed on the interlayer insulating layer 114. The data pad 172 is a pad for transmitting a data voltage to the plurality of sub-pixels SPX. The data voltage may be transferred from the data pad 172 to the source electrode 153 or the drain electrode 154 through a data line formed on the first plate pattern 121. The data pad 172 may be formed of the same material on the same layer as the source electrode 153 and the drain electrode 154, but is not limited thereto.

A planarization layer 144 is formed on the transistor 150 and the interlayer insulating layer 143. The planarization layer 144 planarizes an upper portion of the transistor 150. The planarization layer 144 may be composed of a single layer or a plurality of layers, and may be formed of an organic material. Accordingly, the planarization layer 144 may be referred to as an organic insulating layer. For example, the planarization layer 144 may be formed of an acryl-based organic material, but is not limited thereto.

Referring to FIG. 3, the planarization layer 144 may be disposed on the plurality of first plate patterns 121 to cover upper surfaces and side surfaces of the buffer layer 141, the gate insulating layer 142, and the interlayer insulating layer 143. In addition, the planarization layer 144 surrounds the buffer layer 141, the gate insulating layer 142, and the interlayer insulating layer 143 together with the plurality of first plate patterns 121. Specifically, the planarization layer 144 may be disposed to cover the upper surface and the side surface of the interlayer insulating layer 143, the side surface of the gate insulating layer 142, the side surface of the buffer layer 141, and a part of upper surfaces of the plurality of first plate patterns 121. Accordingly, the planarization layer 144 may compensate for steps between the side surfaces of the buffer layer 141, the gate insulating layer 142, and the interlayer insulating layer 143, and may enhance adhesion strength between the planarization layer 144 and the connection lines 180 disposed on side surfaces of the planarization layer 144.

Referring to FIG. 3, an incline angle of the side surface of the planarization layer 144 may be less than incline angles of the side surfaces of the buffer layer 141, the gate insulating layer 142, and the interlayer insulating layer 143. For example, the side surface of the planarization layer 144 may have a gentle incline angle than incline angles of the side surface of the interlayer insulating layer 143, the side surface of the gate insulating layer 142 and the side surface of the buffer layer 141. Thus, the connection lines 180 in contact with the side surfaces of the planarization layer 144 are disposed to have a gentle incline. Therefore, when the display device 100 is stretched, a stress generated in the connection lines 180 may be reduced. Also, as the side surface of the planarization layer 144 has a relatively gentle incline, it is possible to suppress cracks in the connection lines 180 or peeling of the connection lines 180 from the side surface of the planarization layer 144.

Referring to FIGS. 2 and 3, the connection lines 180 refer to lines that electrically connect the pads disposed on the plurality of first plate patterns 121. The connection lines 180 are disposed on the plurality of first line patterns 122. In addition, the connection lines 180 may also extend on the plurality of first plate patterns 121 to be electrically connected to the power pad 171 and the data pad 172 on the plurality of first plate patterns 121. Also, referring to FIG. 1, the first line pattern 122 is not disposed in an area between the plurality of first plate patterns 121, in which the connection lines 180 are not disposed.

The connection lines 180 include the first connection lines 181 and the second connection lines 182. The first connection lines 181 and the second connection lines 182 are disposed between the plurality of first plate patterns 121. Specifically, the first connection lines 181 refer to lines extended in an X-axis direction X between the plurality of first plate patterns 121 among the connection lines 180. The second connection lines 182 refer to lines extended in a Y-axis direction between the plurality of first plate patterns 121 among the connection lines 180.

The connection lines 180 may be formed of a metal material such as copper (Cu), aluminum (Al), titanium (Ti) or molybdenum (Mo), or the connection lines 180 may have a laminated structure of metal materials such as copper/molybdenum-titanium (Cu/MoTi), titanium/aluminum/titanium (Ti/Al/Ti), and the like, but are not limited thereto.

In a display panel of a general display device, various lines such as a plurality of gate lines and a plurality of data lines are extended in straight lines and disposed between a plurality of sub-pixels, and the plurality of sub-pixels are connected to a single signal line. Therefore, in the display panel of the general display device, various lines such as a gate line, a data line, a high potential power voltage line, a low potential power voltage line, and a reference voltage line are continuously extended on a substrate from one side to the other side of the display panel of an organic light emitting display device.

Unlike this, in the display device 100 according to an example embodiment of the present disclosure, various lines such as a gate line, a data line, a high potential power voltage line, a reference voltage line, an initialization voltage line and the like which are formed in straight lines and considered to be used in a display panel of a general display device, are disposed only on the plurality of first plate patterns 121 and the plurality of second plate patterns 123. That is, in the display device 100 according to an example embodiment of the present disclosure, lines formed in straight lines are disposed only on the plurality of first plate patterns 121 and the plurality of second plate patterns 123.

In the display device 100 according to an example embodiment of the present disclosure, the pads on two adjacent first plate patterns 121 may be electrically connected by the connection lines 180. Accordingly, the connection lines 180 electrically connect the power pads 171 or the data pads 172 on the two adjacent first plate patterns 121. Therefore, the display device 100 according to an example embodiment of the present disclosure may include the plurality of connection lines 180 to electrically connect various lines, such as a gate line, a data line, a high potential voltage line and a reference voltage line, between the plurality of first plate patterns 121.

Meanwhile, referring to FIG. 3, individual connection pads CP1 and a common connection pad CP2 are disposed on the planarization layer 144. The individual connection pads CP1 and the common connection pad CP2 are pads for transmitting signals to a plurality of light emitting elements 160.

Referring to FIGS. 2 and 3, a plurality of individual connection pads CP1 are disposed on the planarization layer 144. The plurality of individual connection pads CP1 may be connected to the transistor 150 and transmit a voltage to the plurality of light emitting elements 160. Accordingly, the plurality of individual connection pads CP1 may perform the same function as an anode.

The plurality of individual connection pads CP1 may be formed on the planarization layer 144 in the same process as connection lines 180. That is, the plurality of individual connection pads CP1 may be formed of the same material and disposed on the same layer as the connection lines 180 and, but are not limited thereto.

The number of the plurality of individual connection pads CP1 disposed on one first plate pattern 121 may be the same as the number of the plurality of light emitting elements 160 disposed on one first plate pattern 121. For example, as shown in FIG. 2, when three light emitting elements 160 are disposed on one first plate pattern 121, in order to apply a separate voltage to each light emitting element 160, three individual connection pads CP1 may be disposed on one first plate pattern 121. Specifically, the individual connection pads CP1 include a first individual connection pad CP1a, a second individual connection pad CP1b, and a third individual connection pad CP1c. The first individual connection pad CP1a, the second individual connection pad CP1b, and the third individual connection pad CP1c may be electrically isolated from one another.

Referring to FIGS. 2 and 3, the common connection pad CP2 is disposed on the planarization layer 144. The common connection pad CP2 may be connected to the first connection line 181 and transmit a voltage to the plurality of light emitting elements 160. Accordingly, the plurality of individual connection pads CP1 may perform the same function as a cathode.

A single common connection pad CP2 may be disposed on one first plate pattern 121, regardless of the number of the plurality of light emitting elements 160 disposed on one first plate pattern 121. For example, as shown in FIG. 2, when three light emitting elements 160 are disposed on one first plate pattern 121, since the common connection pad CP2 only needs to apply a low potential power voltage to the three light emitting elements 160 in the same manner, one common connection pad CP2 is disposed on one first plate pattern 121, and one common connection pad CP2 and three light emitting elements 160 may be electrically connected to each other.

Meanwhile, although not shown in FIG. 3, a bank may be disposed on the individual connection pads CP1, the common connection pad CP2, the connection lines 180, and the planarization layer 144. The bank may function to distinguish the sub-pixels SPX adjacent to each other.

Referring to FIG. 3, the light emitting element 160 is disposed on the individual connection pad CP1 and the common connection pad CP2. The light emitting element 160 includes an n-type layer 161, an active layer 162, a p-type layer 163, an n-electrode 164, and a p-electrode 165. The light emitting element 160 of the display device 100 according to an example embodiment of the present disclosure has a flip-chip structure in which the n-electrode 164 and the p-electrode 165 are disposed on one surface thereof and disposed below the active layer 162.

The n-type layer 161 may be formed by implanting n-type impurities into gallium nitride (GaN) having excellent crystallinity. The n-type layer 161 may be disposed on a separate base substrate formed of a material capable of emitting light.

The active layer 162 is disposed on the n-type layer 161. The active layer 162 is a light emitting layer emitting light from the light emitting element 160, and may be formed of a nitride semiconductor, for example, indium gallium nitride (InGaN).

The p-type layer 163 is disposed on the active layer 162. The p-type layer 163 may be formed by implanting p-type impurities into gallium nitride (GaN).

As described above, the light emitting element 160 according to an example embodiment of the present disclosure is manufactured by sequentially laminating the n-type layer 161, the active layer 162, and the p-type layer 163 and then, etching a predetermined portion of the layers to thereby form the n-electrode 164 and the p-electrode 165. In this case, the predetermined portion is a space to separate the n-electrode 164 and the p-electrode 165 from each other and is etched to expose a part of the n-type layer 161. In other words, a surface of the light emitting element 160 on which the n-electrode 164 and the p-electrode 165 are to be disposed may not be flat and may have different levels of height.

In this manner, the n-electrode 164 is disposed on the etched area, that is, the n-type layer 161 exposed through an etching process. The n-electrode 164 may be formed of a conductive material. Meanwhile, the p-electrode 165 is disposed on a non-etched area, that is, the p-type layer 163.

The p-electrode 165 may also be formed of a conductive material, for example, may be formed of the same material as the n-electrode 164.

An adhesive layer AD is disposed on upper surfaces of the individual connection pads CP1 and the common connection pad CP2 and between the individual connection pads CP1 and the common connection pad CP2, so that the light emitting elements 160 may be bonded onto the individual connection pads CP1 and the common connection pad CP2. In this case, the n-electrode 164 may be disposed on the common connection pad CP2, and the p-electrode 165 may be disposed on the individual connection pad CP1.

The adhesive layer AD may be a conductive adhesive layer in which conductive balls CB are dispersed in a base member BR. Thus, when heat or pressure is applied to the adhesive layer AD, the conductive balls CB may be electrically connected to have conductive properties in a portion of the adhesive layer AD to which heat or pressure is applied.

The conductive balls CB are in the base member BR to be mixed therewith and may have a function of electrically connecting the electrodes of the light emitting element 160 and the common connection pad CP2 and the individual connection pads CP1 when bonding the electrodes of the light emitting elements 160 and the common connection pad CP2 and the individual connection pads CP1. The conductive ball CB may be formed of, for example, a conductive metal having ductility such as gold (Au) inside a material such as nickel (Ni) or the like, but is not limited thereto. In addition, the conductive ball CB may have a diameter of about 4 μm as a reference before bonding, but is not limited thereto. When the electrodes of the light emitting elements 160 and the connection pads are bonded, a material surrounding an inside conductive metal may be broken down by heat and pressure, and the inside conductive metal may be cooled and hardened to thereby electrically connect the electrodes of the light emitting elements 160 and the connection pads.

The base member BR may be an adhesive member having adhesive strength and insulating properties. The base member BR may be, for example, a thermosetting adhesive, but is not limited thereto.

Referring to FIG. 3, for example, the n-electrode 164 is electrically connected to the common connection pad CP2 through the adhesive layer AD, and the p-electrode 165 is electrically connected to the individual connection pad CP1 through the adhesive layer AD. That is, after the adhesive layer AD mixed with the conductive balls CB is applied onto the individual connection pad CP1 and the common connection pad CP2 by a method such as an inkjet or the like, the light emitting element 160 is applied onto the adhesive layer AD. Then, the light emitting element 160 may be pressed and heated, so that the individual connection pad CP1 and the p-electrode 165 and the common connection pad CP2 and the n-electrode 164 may be electrically connected through the conductive balls CB. In this case, the conductive balls CB may be induced to be disposed only between the n-electrode 164 and the common connection pad CP2 and between the p-electrode 165 and the individual connection pad CP1. Meanwhile, other portions of the adhesive layer AD excluding a portion of the adhesive layer AD disposed between the n-electrode 164 and the common connection pad CP2 and a portion of the adhesive layer AD disposed between the p-electrode 165 and the individual connection pad CP1, in which the conductive balls CB of the adhesive layer AD are disposed, have insulating properties. Meanwhile, the adhesive layer AD may be disposed on each of the individual connection pads CP1 and the common connection pads CP2 in a separated form.

As described above, the display device 100 according to an example embodiment of the present disclosure has a structure in which the light emitting element 160 is disposed on the lower substrate 110 on which the transistor 150 is disposed. Thus, when the display device 100 is turned on, different voltage levels applied to each of the individual connection pads CP1 and the common connection pad CP2 are respectively transmitted to the n-electrode 164 and the p-electrode 165, so that the light emitting element 160 emits light.

The upper substrate 112 serves to support various components disposed under the upper substrate 112. Specifically, the upper substrate 112 may be formed by coating and hardening a material for forming the upper substrate 112 on the lower substrate 111 and the first plate patterns 121. The upper substrate 112 may be disposed to be in contact with the lower substrate 111, the first plate patterns 121, the first line pattern 122 and the connection lines 180.

The upper substrate 112 may be formed of the same material as the lower substrate 111. For example, the upper substrate 112 may be formed of silicone rubber such as polydimethylsiloxane (PDMS) or elastomers such as polyurethane (PU) and polytetrafluoroethylene (PTFE). Thus, the upper substrate 112 may have flexibility. However, the materials of the upper substrate 112 are not limited thereto.

Meanwhile, although not shown in FIG. 3, a polarizing layer may also be disposed on the upper substrate 112. The polarizing layer may function to polarize light incident from the outside of the display device 100 and reduce reflection of external light. Further, instead of the polarizing layer, other optical films or the like may be disposed on the upper substrate 112.

In addition, the filling layer 190 that is disposed on an entire surface of the lower substrate 111 and fills a gap between components disposed on the upper substrate 112 and the lower substrate 111 may be disposed. The filling layer 190 may be formed of a curable adhesive. Specifically, a material for forming the filling layer 190 is coated on the entire surface of the lower substrate 111 and then cured, so that the filling layer 190 may be disposed between components disposed on the upper substrate 112 and the lower substrate 111. For example, the filling layer 190 may be an optically clear adhesive (OCA), and may include an acrylic adhesive, a silicone adhesive, and a urethane adhesive.

Figure 4:
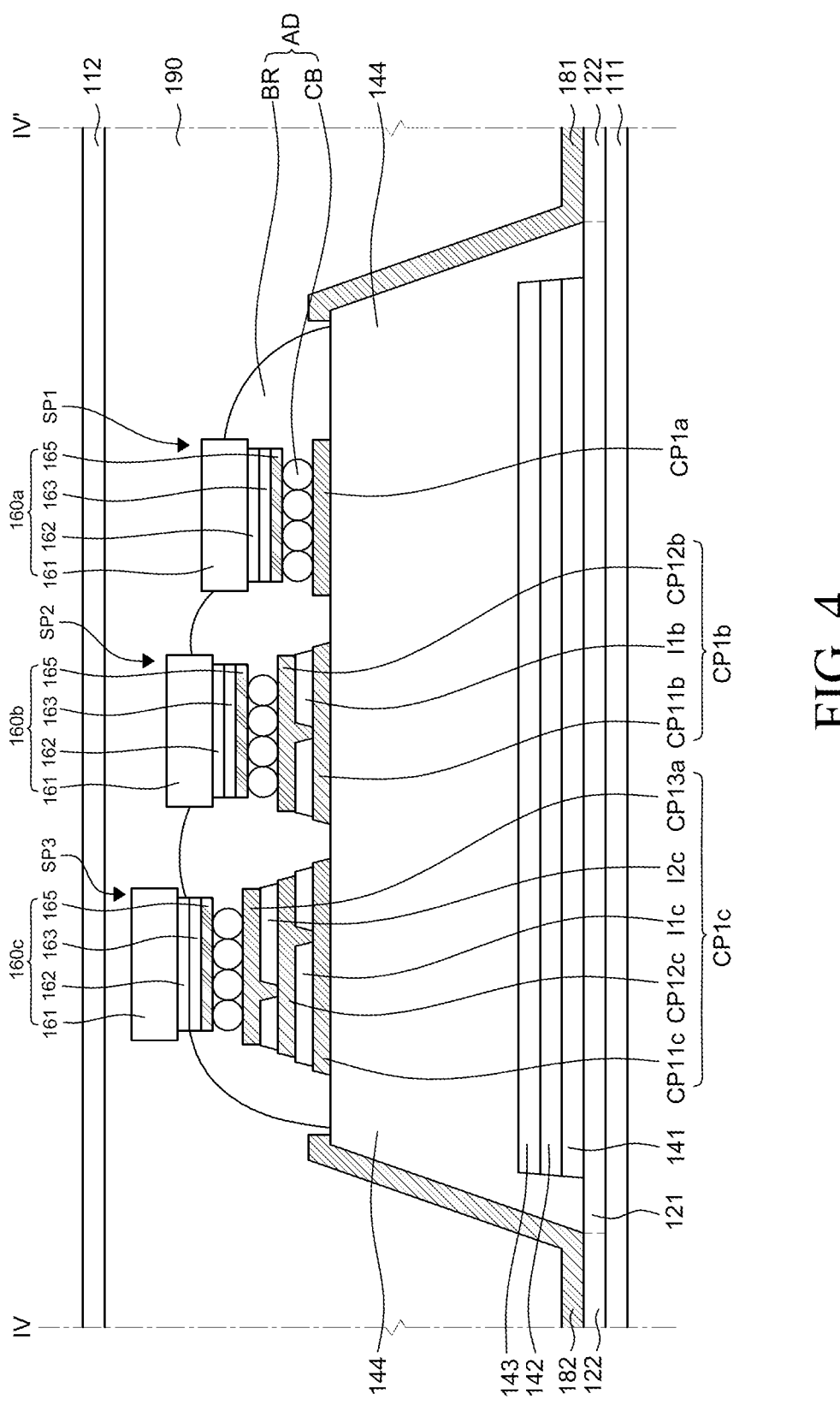
FIG. 4 is a cross-sectional view taken along cutting line IV-IV' shown in FIG. 2.
Figure 5:
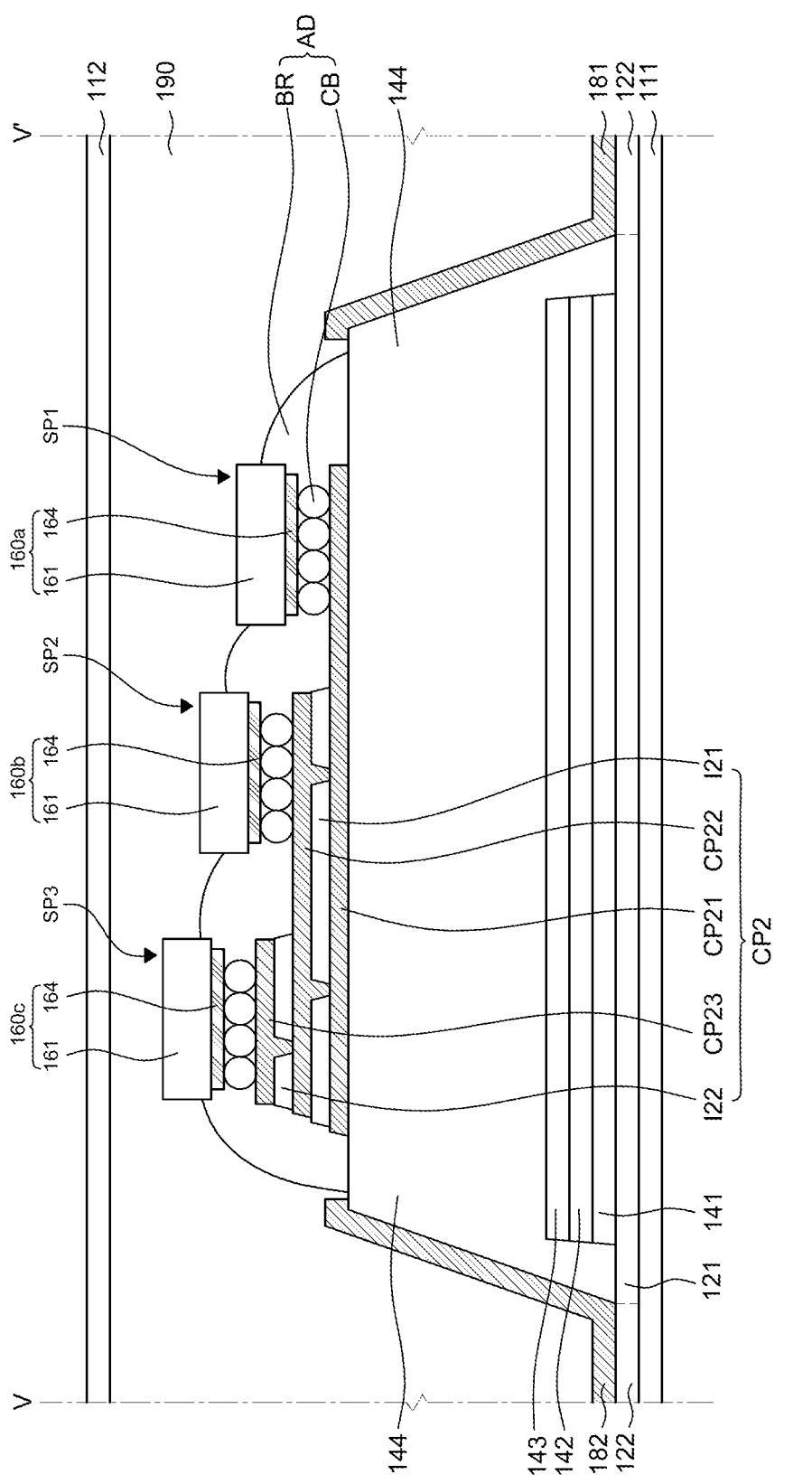
FIG. 5 is a cross-sectional view taken along cutting line V-V' shown in FIG. 2.

Hereinafter, FIGS. 4 to 5 are referred together for a more detailed description of the individual connection pads CP1 and the common connection pad CP2 of each of the plurality of sub-pixels SPX.

Cross-Sectional Structures of Individual Connection Pads and Common Connection Pad FIG. 4 is a cross-sectional view taken along cutting line IV-IV' shown in FIG. 2. FIG. 5 is a cross-sectional view taken along cutting line V-V' shown in FIG. 2.

Referring to FIG. 4, the plurality of individual connection pads CP1 include a first individual connection pad CP1*a* corresponding to the first sub-pixel SP1, a second individual connection pad CP1*b* corresponding to the second sub-pixel SP2, and a third individual connection pad CP1*c* corresponding to the third sub-pixel SP3.

The plurality of light emitting elements 160 include a first light emitting element 160*a* disposed in the first sub-pixel SP1, a second light emitting element 160*b* disposed in the second sub-pixel SP2, and a third light emitting element 160*c* disposed in the third sub-pixel SP3. The p-electrode 165 of the first light emitting element 160*a* may be electrically connected to the first individual connection pad CP1a through the conductive balls CB. The p-electrode 165 of the second light emitting element 160b may be electrically connected to the second individual connection pad CP1b through the conductive balls CB. The p-electrode 165 of the third light emitting element 160c may be electrically connected to the third individual connection pad CP1c through the conductive balls CB.

The plurality of individual connection pads CP1 have different heights corresponding to the plurality of respective sub-pixels SPX. The first individual connection pad CP1a may be formed of one conductive layer. The second individual connection pad CP1b and the third individual connection pad CP1c may be formed of a plurality of conductive layers CP11b, CP12b, CP11c, CP12c, and CP13c and at least one or more insulating layers I1b, I1c, and I2c disposed between the plurality of conductive layers CP11b, CP12b, CP11c, CP12c, and CP13c. Specifically, the second individual connection pad CP1b may be disposed in an order of a first conductive layer CP11b, the insulating layer I1b disposed on the first conductive layer CP11b, and a second conductive layer CP12b. The first conductive layer CP11b and the second conductive layer CP12b may be electrically connected through a contact hole of the insulating layer I1b. The third individual connection pad CP1c may be disposed in an order of a first conductive layer CP11c, a first insulating layer I1c, a second conductive layer CP12c, a second insulating layer I2c, and a third conductive layer CP13c. The conductive layers CP11c, CP12c, and CP13c that are adjacent to and different from each other may be electrically connected to each other through contact holes of the first insulating layer I1c and the second insulating layer I2c.

Each of the conductive layers CP1a, CP11b, CP12b, CP11c, CP12c, and CP13c that are included in the first individual connection pad CP1a, the second individual connection pad CP1b, and the third individual connection pad CP1c may be formed of the same material as the common connection pad CP2. For example, each of the conductive layers CP1a, CP11b, CP12b, CP11c, CP12c, and CP13c may be formed of any one of molybdenum (Mo), aluminum (Al), chromium (Cr), gold (Au), titanium (Ti), nickel (Ni), neodymium (Nd) and copper (Cu), an alloy of two or more of them, or multiple layers thereof, but the present disclosure is not limited thereto.

A thickness of each of the conductive layers CP1a, CP11b, CP12b, CP11c, CP12c, and CP13c constituting the plurality of individual connection pads CP1 may be 0.5 μm to 1 μm, but the present disclosure is not limited thereto.

The at least one or more insulating layers I1b, I1c, and I2c included in the second individual connection pad CP1b and the third individual connection pad CP1c may be formed of an organic insulating layer or an inorganic insulating layer. For example, the at least one or more insulating layers I1b, I1c, and I2c may be formed of an acryl-based organic material. Alternatively, the at least one or more insulating layers I1b, I1c, and I2c may be composed of a single layer or multilayers formed of at least one of silicon nitride (SiNx), silicon oxide (SiOx), and silicon oxynitride (SiON). A thickness of each of the at least one or more insulating layers I1b, I1c, and I2c may be 1 μm to 3 μm, but the present disclosure is not limited thereto.

The plurality of individual connection pads CP1 may be formed to have different heights. For example, as shown in FIG. 4, the first individual connection pad CP1a, the second individual connection pad CP1b, and the third individual connection pad CP1c may have heights increasing in a leftward direction from the first individual connection pad CP1a. However, the present disclosure is not limited thereto, and the first individual connection pad CP1a, the second individual connection pad CP1b, and the third individual connection pad CP1c may have heights increasing in a rightward direction from the third individual connection pad CP1c. A difference in height between the individual connection pads CP1 that are adjacent to and different from each other may be 2 μm to 10 μm. This is a range in which a minimum margin can be considered and a sense of distance according to the height when the light emitting element 160 is turned on can be reduced or minimized.

Referring to FIG. 5, the common connection pad CP2 is formed of a plurality of conductive layers CP21, CP22, and CP23 and a plurality of insulating layers I21 and I22. Specifically, the common connection pad CP2 may include a first conductive layer CP21 disposed in the first sub-pixel SP1, the second sub-pixel SP2, and the third sub-pixel SP3, a first insulating layer I21 disposed on the first conductive layer CP21 in the second sub-pixel SP2 and the third sub-pixel SP3, a second conductive layer CP22 disposed on the first insulating layer I21 in the second sub-pixel SP2 and the third sub-pixel SP3, a second insulating layer I22 disposed on the second conductive layer CP22 in the third sub-pixel SP3, and a third conductive layer CP23 disposed on the second insulating layer I22 in the third sub-pixel SP3. The first conductive layer CP21, the second conductive layer CP22, and the third conductive layer CP23 that are adjacent to and different from each other may be electrically connected through contact holes of the first insulating layer I21 and the second insulating layer I22.

Referring to FIG. 5, the first conductive layer CP21 may be commonly disposed in the first sub-pixel SP1, the second sub-pixel SP2, and the third sub-pixel SP3. The second conductive layer CP22 and the first insulating layer I21 may be disposed only in the second sub-pixel SP2 and the third sub-pixel SP3. In addition, the second insulating layer I22 and the third conductive layer CP23 may be disposed only in the third sub-pixel SP3.

The n-electrode 164 of the first light emitting element 160a may be electrically connected to the first conductive layer CP21 of the common connection pad CP2 through the conductive balls CB. The n-electrode 164 of the second light emitting element 160b may be electrically connected to the second conductive layer CP22 of the common connection pad CP2 through the conductive balls CB. The n-electrode 164 of the third light emitting element 160c may be electrically connected to the third conductive layer CP23 of the common connection pad CP2 through the conductive balls CB.

The common connection pad CP2 may be formed in the same process as the plurality of individual connection pads CP1. That is, the first conductive layer CP21 of the common connection pad CP2 may be formed of the same material and disposed on the same layer as the first conductive layers CP1a, CP11b, and CP11c of the plurality of individual connection pads CP1. The second conductive layer CP22 of the common connection pad CP2 may be formed of the same material and disposed on the same layer as the second conductive layers CP12b and CP12c of the plurality of individual connection pads CP1. The third conductive layer CP23 of the common connection pad CP2 may be formed of the same material and disposed on the same layer as the third conductive layer CP13c of the plurality of individual connection pads CP1. In this case, a thickness of each of the conductive layers CP21, CP22, and CP23 constituting the common connection pad CP2 may be 0.5 μm to 1 μm, but the present disclosure is not limited thereto.

The plurality of insulating layers I21 and I22 disposed on the common connection pad CP2 may also be formed in the same process as the plurality of individual connection pads CP1. That is, the first insulating layer I21 of the common connection pad CP2 may be formed of the same material and disposed on the same layer as the first insulating layers I1b and I1c of the plurality of individual connection pads CP1. The second insulating layer I22 of the common connection pad CP2 may be formed of the same material and disposed on the same layer as the second insulating layer I2c of the plurality of individual connection pads CP1. A thickness of each of first insulating layer I21 and the second insulating layer I22 may be 1 μm to 3 μm, but the present disclosure is not limited thereto.

A width of the first conductive layer CP21 disposed at a lowermost portion among the plurality of conductive layers CP21, CP22, and CP23 of the common connection pad CP2 may be greater than a width of the second conductive layer CP22. The width of the second conductive layer CP22 may be greater than a width of the third conductive layer CP23 disposed at an uppermost portion among the plurality of conductive layers CP21, CP22, and CP23 of the common connection pad CP2. In other words, the width of the first conductive layer CP21 disposed at the lowermost portion may be the greatest and the width of the third conductive layer CP23 disposed at the uppermost portion may be the smallest.

As shown in FIG. 5, the common connection pad CP2 is sequentially increased in height in the order of the first sub-pixel SP1, the second sub-pixel SP2, and the third sub-pixel SP3. That is, the common connection pad CP2 may be sequentially increased in height to correspond to sequential increases in heights of the plurality of individual connection pads CP1. In FIG. 5, the plurality of conductive layers CP21, CP22, and CP23 and the plurality of insulating layers I21 and I22 are disposed so that the common connection pad CP2 has heights increasing in a leftward direction, but this is only one example, the common connection pad CP2 may have heights increasing in a rightward direction.

The height of the common connection pad CP2 corresponding to the first sub-pixel SP1 is equal to a height of the first individual connection pad CP1a. The height of the common connection pad CP2 corresponding to the second sub-pixel SP2 is equal to a height of the second individual connection pad CP1b. The height of the common connection pad CP2 corresponding to the third sub-pixel SP3 is equal to a height of the third individual connection pad CP1c. In other words, since the common connection pad CP2 corresponding to the first sub-pixel SP1 and the first individual connection pad CP1a have the same height, the n-electrode 164 and the p-electrode 165 of the first light emitting element 160a may be disposed horizontally. Further, since the common connection pad CP2 corresponding to the second sub-pixel SP2 and the second individual connection pad CP1b have the same height, the n-electrode 164 and the p-electrode 165 of the second light emitting element 160b may be disposed horizontally. Also, since the common connection pad CP2 corresponding to the third sub-pixel SP3 and the third individual connection pad CP1c have the same height, the n-electrode 164 and the p-electrode 165 of the third light emitting element 160c may be disposed horizontally.

Method of Manufacturing Display Device

Figure 6A:
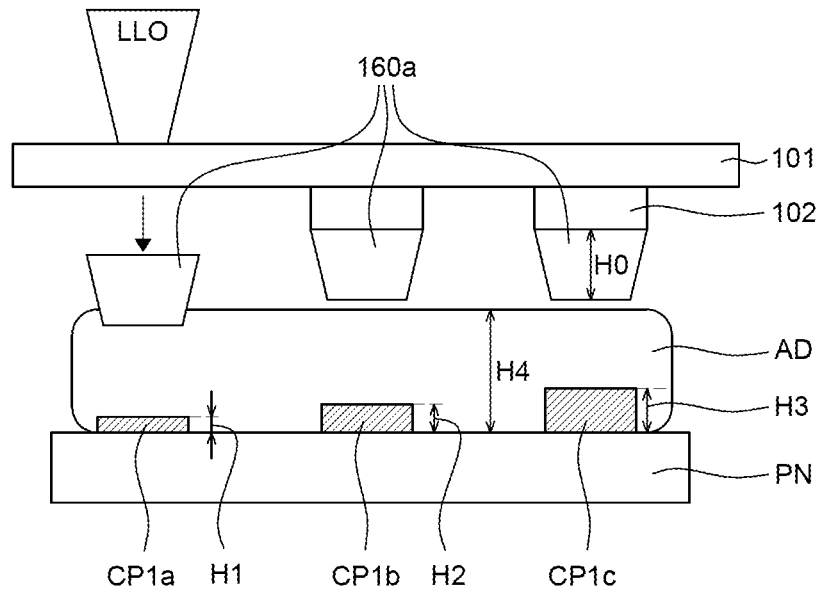
FIGS. 6A to 6C are schematic cross-sectional views of a method of manufacturing a display device according to an example embodiment of the present disclosure.
Figure 6B:
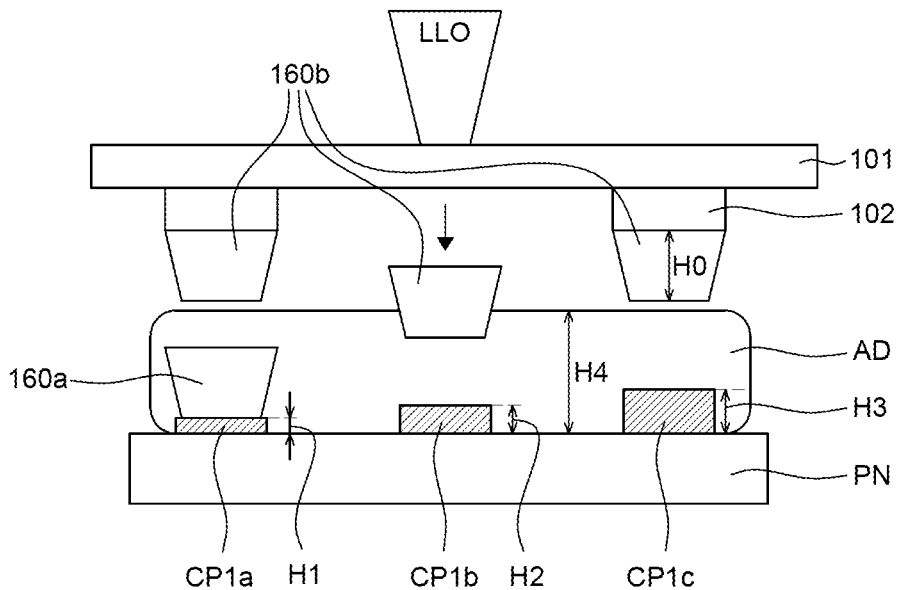
Figure 6C:
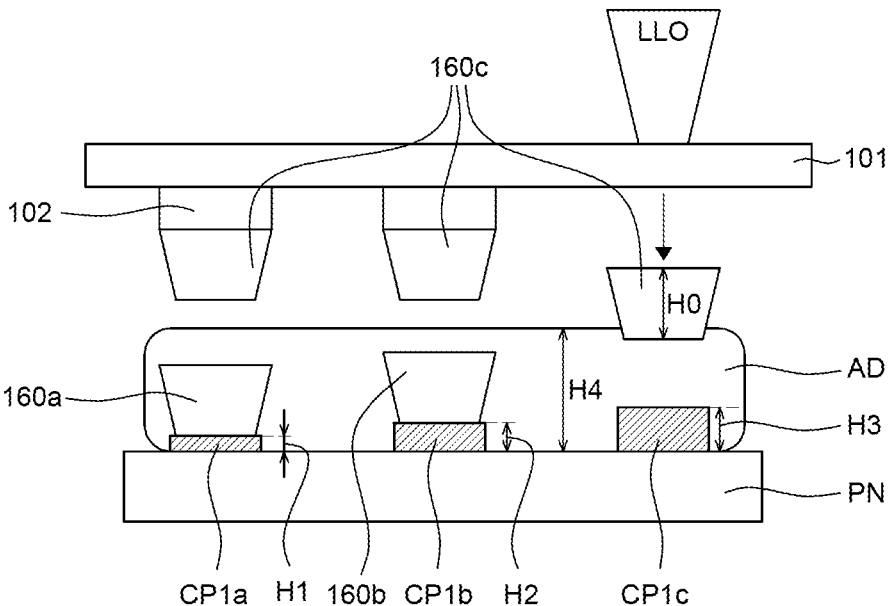

FIGS. 6A to 6C are schematic cross-sectional views of a method of manufacturing the display device 100 according to an example embodiment of the present disclosure. FIGS.

6A to 6C are schematic process views for explaining a transfer process of transferring the plurality of light emitting elements 160 to the display panel PN. FIGS. 6A to 6C illustrate only the plurality of individual connection pads CP1 among components of the display device 100 on the display panel PN for convenience of explanation. A redundant description of the individual connection pads CP1 and the plurality of light emitting elements 160 among the components described in the display device 100 of FIGS. 1 to 5 will be omitted.

The display panel PN is a display panel where a forming of circuits for driving the plurality of light emitting elements 160, for example, transistors and a plurality of lines has been completed. For example, referring to FIGS. 3 to 5, the display panel PN may have a structure in which the individual connection pads CP1, the common connection pad CP2, the connection lines 180, and the adhesive layer AD are formed on the planarization layer 144 before the filling layer 190 and the upper substrate 112 are formed.

Referring to FIGS. 6A to 6C, a wafer 101 is a substrate on which the plurality of light emitting elements 160 are formed. A material such as gallium nitride (GaN) or indium gallium nitride (InGaN) constituting the plurality of light emitting elements 160 is formed on the wafer 101 to grow a crystal layer, the crystal layer is cut into individual chips, and electrodes are formed thereon, so that the plurality of light emitting elements 160 may be formed. The wafer 101 may be formed of sapphire, silicon carbide (SiC), gallium nitride (GaN), zinc oxide (ZnO), or the like, but is not limited thereto.

A plurality of temporary patterns 102 are to attach the plurality of light emitting elements 160 to the wafer 101 and are material layers that can be peeled off from the wafer 101 using a laser lift off (LLO) process. That is, when a wavelength of high energy, such as a laser, is irradiated onto the wafer 101 to which the plurality of light emitting elements 160 are attached through the temporary patterns 102, surfaces of the temporary patterns 102 are rapidly melted and vaporized, so that the plurality of the light emitting elements 160 can be easily separated.

The plurality of light emitting elements 160 emitting light of the same color are formed on one wafer 101. In FIG. 6A, the plurality of temporary patterns 102 may be formed on the wafer 101, and a plurality of first light emitting elements 160a may be formed on the respective temporary patterns 102. In FIG. 6B, the plurality of temporary patterns 102 may be formed on the wafer 101, and a plurality of second light emitting elements 160b may be formed on the respective temporary patterns 102. In FIG. 6C, the plurality of temporary patterns 102 may be formed on the wafer 101, and a plurality of third light emitting elements 160c may be formed on the respective temporary patterns 102.

The first individual connection pad CP1a, the second individual connection pad CP1b, and the third individual connection pad CP1c sequentially increase in height. As shown in FIG. 4, the second individual connection pad CP1b and the third individual connection pad CP1c may be formed of a plurality of layers including a plurality of conductive layers CP1a, CP11b, CP12b, CP11c, CP12c, and CP13c and at least one or more insulating layers I1b, I1c, and I2c. However, in FIGS. 6A to 6C, the plurality of layers are omitted for convenience of illustration and they are illustrated as one layer.

Although not shown in the drawings, a portion of the common connection pad CP2 corresponding to the first sub-pixel SP1, a portion of the common connection pad CP2 corresponding to the second sub-pixel SP2, and a portion of the common connection pad CP2 corresponding to the third sub-pixel SP3 also have heights corresponding to the first individual connection pad CP1$a$ (i.e., height H1), the second individual connection pad CP1$b$ (i.e., height H2), and the third individual connection pad CP1$c$ (i.e., height H3), respectively.

The adhesive layer AD may be applied onto the display panel PN at a sufficient thickness to cover the third individual connection pad CP1$c$ so that the third light emitting element 160$c$ which will be transferred onto the third individual connection pad CP1$c$ having the greatest height can be stably attached. For example, as shown in FIGS. 6A to 6C, the thickness H4 or the height H4 of the adhesive layer AD is greater than a height H3 of the third individual connection pad CP1$c$ and a height H0 of one light emitting element among the plurality of light emitting elements 160. In some embodiments, each height H0 of the light emitting element among the plurality of light emitting elements 160 may be different from each other, although FIGS. 6A to 6C illustrated the height H0 being equal for all light emitting element among the plurality of light emitting elements 160. In these instances, the thickness H4 or the height H4 of the adhesive layer AD may still be greater than any one of H0+H1, H0+H2, H0+H3, so that the connection pads CP1$a$, CP1$b$, CP1$c$ are stably attached to the display panel PN.

Referring to FIGS. 6A to 6C, when the plurality of light emitting elements 160 are transferred to the display panel PN, they are transferred onto the plurality of individual connection pads CP11$n$ the order of having a lower height. That is, the height H1 of the first individual connection pad CP1$a$ is smaller than the height H2 of the second individual connection pad CP1$b$, and the height H3 of the third individual connection pad CP1$c$ is greater than the height H2 of the second individual connection pad CP1$b$.

Referring to FIG. 6A, the plurality of first light emitting elements 160$a$ are transferred to the display panel PN so as to be connected to the first individual connection pads CP1$a$ that correspond to the first sub-pixels SP1 and have a lowest height. The first light emitting elements 160$a$ may be directly transferred from the wafer 101 to the display panel PN through the LLO process.

Next, referring to FIG. 6B, in the display panel PN to which the first light emitting elements 160$a$ have been transferred, the plurality of second light emitting elements 160$b$ are transferred to the display panel PN so as to be connected to the second individual connection pads CP1$b$ that correspond to the second sub-pixels SP2 and have a height higher than that of the first individual connection pads CP1$a$. The second light emitting elements 160$b$ may be directly transferred from the wafer 101 to the display panel PN through the LLO process.

Next, referring to FIG. 6C, in the display panel PN to which the first light emitting elements 160$a$ and the second light emitting elements 160$b$ have been transferred, the plurality of third light emitting elements 160$c$ are transferred to the display panel PN so as to be connected to the third individual connection pads CP1$c$ that correspond to the third sub-pixels SP3 and have a highest height. The third light emitting element 160$c$ may be directly transferred from the wafer 101 to the display panel PN through the LLO process.

FIGS. 6A to 6C illustrate one example embodiment of a portion of the method steps for manufacturing a display device. The method includes forming at least one temporary pattern 102 on the wafer 101. The method includes forming at least one light emitting element 160 on the at least one temporary pattern 102, respectively. The method includes providing at least one individual connection pad CP1$a$, CP1$b$, CP1$c$, on the display panel PN. The method includes separating the at least one light emitting element 160 from the at least one temporary pattern 102. The method also includes transferring the at least one light emitting element 160 to the at least one individual connection pad CP1$a$, CP1$b$, CP1$c$ on the display panel PN, respectively.

In one embodiment, separating the at least one light emitting element from the at least one temporary pattern includes applying a laser lift off process to the at least one temporary pattern, and removing at least a portion of the at least one temporary pattern sufficiently that the at least one light emitting element is separated from the at least one temporary pattern.

In one embodiment, transferring the at least one light emitting element to the at least one individual connection pad on the display panel includes sequentially transferring the at least one light emitting element to the at least one individual connection pad having a lowest height to the at least one individual connection pad having a highest height. That is, FIGS. 6A to 6C illustrate the light emitting elements 160 being attached to the individual connection pads in the order from CP1$a$, CP1$b$, and CP1$c$.

Accordingly, in the method of manufacturing the display device 100 according to an example embodiment of the present disclosure, when the plurality of light emitting elements 160 emitting light of different colors are transferred to the display panel PN, since there is a difference in heights of the plurality of individual connection pads CP1 or the common connection pad CP2 onto which the light emitting elements 160 are transferred, the light emitting elements 160 are able to be directly transferred from the wafer 101 to the display panel PN without interference between the light emitting elements 160 that are disposed on the wafer 101 and the light emitting elements 160 that have been transferred to the display panel PN. In other words, the plurality of light emitting elements 160 may be directly transferred to the display panel PN to correspond to the plurality of sub-pixels SPX without a process of transferring them to a donor substrate. Accordingly, a display device having a simplified manufacturing process and reduced cost may be manufactured.

The example embodiments of the present disclosure can also be described as follows:

According to an aspect of the present disclosure, there is provided a display device. The display device includes a stretchable lower substrate, and a pattern layer disposed on the lower substrate and including a plurality of plate patterns on which a plurality of sub-pixels are disposed and a plurality of line patterns, a plurality of individual connection pads and a common connection pad disposed on each of the plurality of plate patterns and having different heights corresponding to each of the plurality of sub-pixels, and a plurality of light emitting elements connected to the plurality of individual connection pads and the common connection pad.

The plurality of sub-pixels may include a first sub-pixel, a second sub-pixel, and a third sub-pixel. The plurality of individual connection pads may include a first individual connection pad corresponding to the first sub-pixel, a second individual connection pad corresponding to the second sub-pixel, and a third individual connection pad corresponding to the third sub-pixel. The first individual connection pad, the second individual connection pad, and the third individual connection pad may be electrically isolated from each other.

The first individual connection pad may be formed of one conductive layer.

The second individual connection pad and the third individual connection pad may be formed of a plurality of conductive layers and at least one insulating layer disposed between the plurality of conductive layers.

The common connection pad may be formed of a plurality of conductive layers and a plurality of insulating layers.

The common connection pad may include a first conductive layer disposed in the first sub-pixel, the second sub-pixel, and the third sub-pixel, a first insulating layer disposed on the first conductive layer in the second sub-pixel and the third sub-pixel, a second conductive layer disposed on the first insulating layer in the second sub-pixel and the third sub-pixel, a second insulating layer disposed on the second conductive layer in the third sub-pixel, and a third conductive layer disposed on the second insulating layer in the third sub-pixel.

A width of the first conductive layer may be greater than a width of the second conductive layer, and the width of the second conductive layer may be greater than a width of the third conductive layer.

A height of the common connection pad corresponding to the first sub-pixel may be equal to a height of the first individual connection pad, a height of the common connection pad corresponding to the second sub-pixel may be equal to a height of the second individual connection pad, and a height of the common connection pad corresponding to the third sub-pixel may be equal to a height of the third individual connection pad.

According to another aspect of the present disclosure, there is provided a display device. The display device includes a stretchable lower substrate including an active area and a non-active area outside the active area, a plurality of plate patterns which are disposed on the lower substrate and on which a plurality of pixels including a plurality of sub-pixels are disposed in the active area, a common connection pad formed of a plurality of layers on each of the plurality of plate patterns, and a plurality of individual connection pads corresponding to each of the plurality of sub-pixels and formed of at least one layer.

The plurality of sub-pixels may include a first sub-pixel, a second sub-pixel, and a third sub-pixel. The plurality of individual connection pads may include a first individual connection pad corresponding to the first sub-pixel, a second individual connection pad corresponding to the second sub-pixel, and a third individual connection pad corresponding to the third sub-pixel. The first individual connection pad, the second individual connection pad, and the third individual connection pad may have different heights from each other.

The common connection pad may be formed of a plurality of conductive layers and a plurality of insulating layers.

A height of the common connection pad corresponding to the first sub-pixel may be equal to a height of the first individual connection pad, a height of the common connection pad corresponding to the second sub-pixel may be equal to a height of the second individual connection pad, and a height of the common connection pad corresponding to the third sub-pixel may be equal to a height of the third individual connection pad.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:

a stretchable lower substrate; and a pattern layer disposed on the lower substrate and including a plurality of plate patterns on which a plurality of sub-pixels are disposed and a plurality of line patterns;

a plurality of individual connection pads and a common connection pad disposed on each of the plurality of plate patterns and having different heights corresponding to each of the plurality of sub-pixels; and a plurality of light emitting elements each electrically connected to a corresponding one of the plurality of individual connection pads and the common connection pad, wherein the plurality of plate patterns are physically spaced apart from each other with a space therebetween and the plurality of line patterns are disposed in the space between the plurality of plate patterns to connect two adjacent plate patterns, wherein the plurality of plate patterns and the plurality of line patterns are formed of an insulating material, wherein the plurality of sub-pixels includes a first sub-pixel, a second sub-pixel, and a third sub-pixel, wherein the common connection pad of each of the plurality of plate patterns includes, a first conductive layer overlapping the first sub-pixel, the second sub-pixel, and the third sub-pixel;

a first insulating layer disposed on the first conductive layer and overlapping the second sub-pixel and the third sub-pixel;

a second conductive layer disposed on the first insulating layer and overlapping the second sub-pixel and the third sub-pixel;

a second insulating layer disposed on the second conductive layer and overlapping the third sub-pixel; and a third conductive layer disposed on the second insulating layer and overlapping the third sub-pixel, wherein a portion of the first conductive layer overlapping the first sub-pixel is exposed from the first insulating layer, the second conductive layer, the second insulating layer, and the third conductive layer and is electrically connected to a first light emitting element of the plurality of light emitting elements, and a portion of the second conductive layer overlapping the second sub-pixel is exposed from the second insulating layer and the third conductive layer and is electrically connected to a second light emitting element of the plurality of light emitting elements.

2. The display device of claim 1, wherein the plurality of individual connection pads includes a first individual connection pad corresponding to the first sub-pixel, a second individual connection pad corresponding to the second sub-pixel, and a third individual connection pad corresponding to the third sub-pixel, wherein the first individual connection pad, the second individual connection pad, and the third individual connection pad are electrically isolated from each other.

3. The display device of claim 2, wherein the first individual connection pad is formed of one conductive layer.

4. The display device of claim 2, wherein the second individual connection pad and the third individual connection pad are formed of a plurality of conductive layers and at least one insulating layer disposed between the plurality of conductive layers.

5. The display device of claim 2, wherein a height of the common connection pad corresponding to the first sub-pixel is equal to a height of the first individual connection pad, a height of the common connection pad corresponding to the second sub-pixel is equal to a height of the second individual connection pad, and a height of the common connection pad corresponding to the third sub-pixel is equal to a height of the third individual connection pad.

6. The display device of claim 1, wherein a width of the first conductive layer is greater than a width of the second conductive layer, and the width of the second conductive layer is greater than a width of the third conductive layer.

7. A display device, comprising:

a stretchable lower substrate including an active area and a non-active area outside the active area;

a plurality of plate patterns which are disposed on the lower substrate and physically spaced apart from each other with a space therebetween and on which a plurality of pixels including a plurality of sub-pixels are disposed in the active area;

a plurality of line patterns disposed in the space between the plurality of plate patterns to connect two adjacent plate patterns;

a common connection pad formed of a plurality of layers on each of the plurality of plate patterns;

a plurality of individual connection pads corresponding to each of the plurality of sub-pixels and formed of at least one layer; and a plurality of light emitting elements each electrically connected to a corresponding one of the plurality of individual connection pads and the common connection pad, wherein the plurality of plate patterns and the plurality of line patterns are formed of an insulating material, wherein the plurality of sub-pixels includes a first sub-pixel, a second sub-pixel, and a third sub-pixel, wherein the common connection pad of each of the plurality of plate patterns includes, a first conductive layer overlapping the first sub-pixel, the second sub-pixel, and the third sub-pixel;

a first insulating layer disposed on the first conductive layer and overlapping the second sub-pixel and the third sub-pixel;

a second conductive layer disposed on the first insulating layer and overlapping the second sub-pixel and the third sub-pixel;

a second insulating layer disposed on the second conductive layer and overlapping the third sub-pixel; and a third conductive layer disposed on the second insulating layer and overlapping the third sub-pixel, wherein a portion of the first conductive layer overlapping the first sub-pixel is exposed from the first insulating layer, the second conductive layer, the second insulating layer, and the third conductive layer and is electrically connected to a first light emitting element of the plurality of light emitting elements, and a portion of the second conductive layer overlapping the second sub-pixel is exposed from the second insulating layer and the third conductive layer and is electrically connected to a second light emitting element of the plurality of light emitting elements.

8. The display device of claim 7, wherein the plurality of individual connection pads includes a first individual connection pad corresponding to the first sub-pixel, a second individual connection pad corresponding to the second sub-pixel, and a third individual connection pad corresponding to the third sub-pixel, wherein the first individual connection pad, the second individual connection pad, and the third individual connection pad have different heights from each other.

9. The display device of claim 8, wherein a height of the common connection pad corresponding to the first sub-pixel is equal to a height of the first individual connection pad, a height of the common connection pad corresponding to the second sub-pixel is equal to a height of the second individual connection pad, and a height of the common connection pad corresponding to the third sub-pixel is equal to a height of the third individual connection pad.

* * * * *